United States Patent [19]

Lerner et al.

[11] Patent Number: 5,007,983
[45] Date of Patent: Apr. 16, 1991

[54] ETCHING METHOD FOR PHOTORESISTS OR POLYMERS

[75] Inventors: Narcinda R. Lerner, Woodside; Theodore J. Wydeven, Jr., Sunnyvale, both of Calif.

[73] Assignee: The United States of America as represented by the Administrator of National Aeronautics & Space Administration, Washington, D.C.

[21] Appl. No.: 347,591

[22] Filed: May 4, 1989

Related U.S. Application Data

[63] Continuation-in-part of Ser. No. 150,169, Jan. 29, 1988, abandoned.

[51] Int. Cl.$^5$ .............................. H01L 21/306
[52] U.S. Cl. ..................... 156/643; 156/668; 156/345; 437/229; 204/192.32
[58] Field of Search ............ 156/643, 345, 668; 204/192.32; 437/229

[56] References Cited

U.S. PATENT DOCUMENTS

| | | | |
|---|---|---|---|
| 3,692,655 | 9/1972 | Vossen | 204/192.32 |
| 4,175,235 | 11/1979 | Niwa et al. | 156/643 |
| 4,243,476 | 1/1981 | Ahn et al. | 156/643 |
| 4,368,092 | 1/1983 | Steinberg et al. | 156/345 |
| 4,412,119 | 10/1983 | Nomatsu et al. | 156/643 |
| 4,554,047 | 11/1985 | Cook et al. | 156/643 |
| 4,595,570 | 6/1986 | Fuhuta et al. | 156/643 |
| 4,612,099 | 9/1986 | Tanno et al. | 204/192.32 |

OTHER PUBLICATIONS

Curran, J. E., "Physical and Chemical Etching in Plasmas", Thin Solid Films, 86 (1981), pp. 101–110.
Vukanovic et al. in *J. Vac. Sci. Technol.*, vol. 6, No. 1, entitled "Plasma Etching of Organic Materials II. Polyimide Etching and Passivation Downstream of an $O_2$-$CF_4$-Ar Microwave Plasma" (Jan./Feb. 1988).
*VLSI Technology*, edited by S. M. Sze, published by the McGraw-Hill Company of New York, N.Y., pp. 328–330 (1983).
*Plasma Etching: An Introduction*, edited by D. M. Manos and D. L. Flamm, pp. 19 and 102, published by Academic Press, Inc. (1989).

Primary Examiner—Richard V. Fisher
Assistant Examiner—Todd J. Burns
Attorney, Agent, or Firm—Darrell G. Brekke; John R. Manning; Harold W. Adams

[57] ABSTRACT

A method for etching or removing polymers, photoresists, and organic contaminants from a substrate is disclosed. The method includes creating a more reactive gas species by producing a plasma discharge in a reactive gas such as oxygen and contacting the resulting gas species with a sacrificial solid organic material (13A) such as polyethylene or poly(vinyl fluoride), producing a highly reactive gas species, which in turn etches the starting polymer, organic contaminant, or photoresist (13). The sample to be etched is located away from the plasma glow discharge region (11) so as to avoid damaging the substrate by exposure to high-energy particles and electric fields encountered in that region. Greatly increased etching rates are obtained. This method is highly effective for etching polymers such as polyimides and photoresists that are otherwise difficult or slow to etch downstream from an electric discharge in a reactive gas.

14 Claims, 5 Drawing Sheets

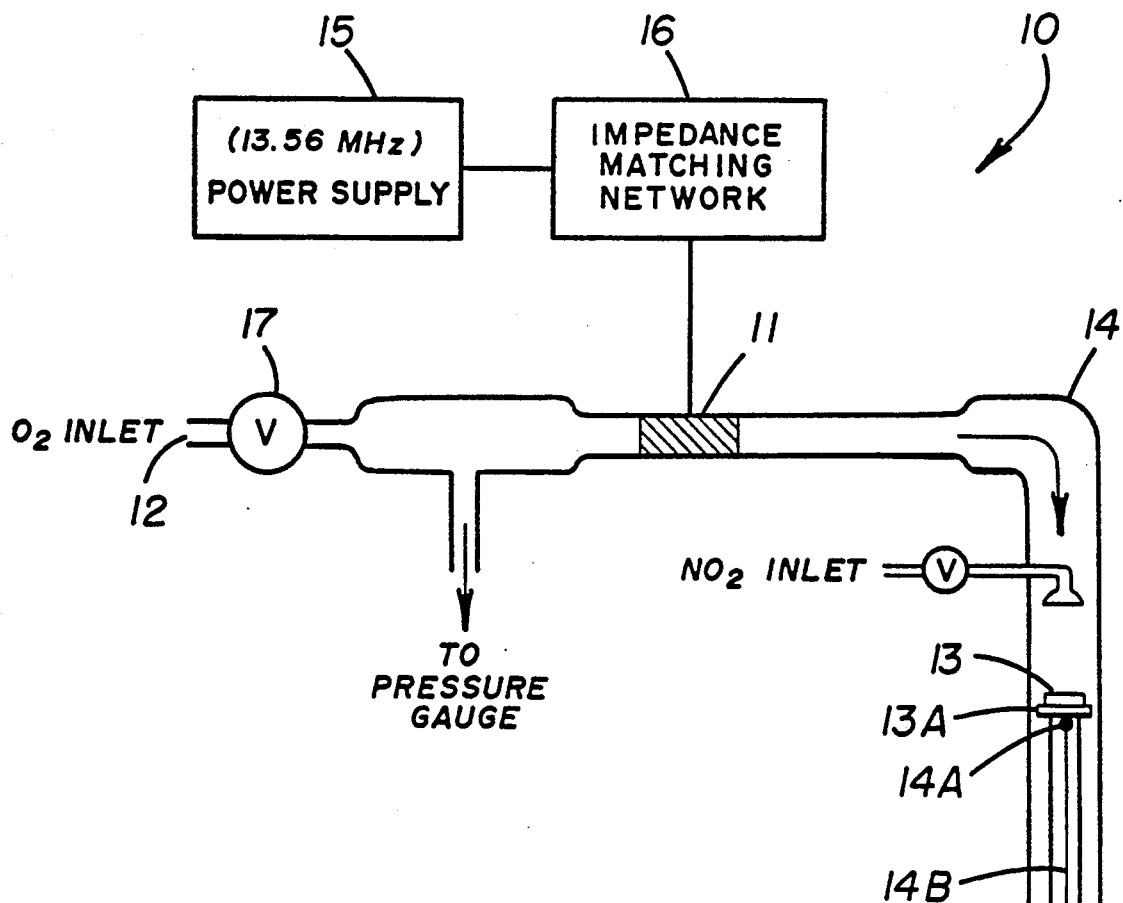
FIGURE 1
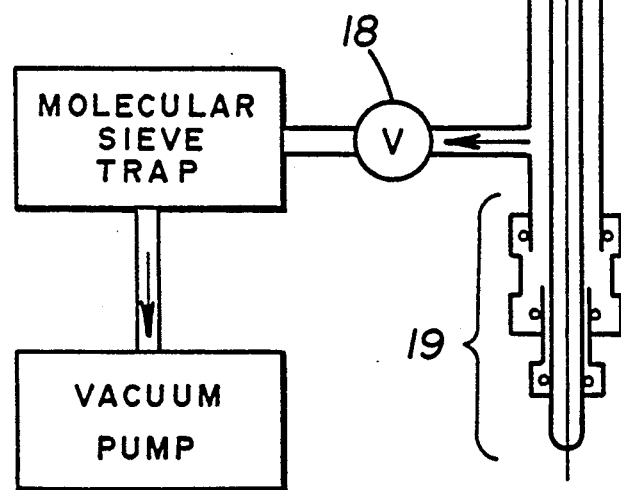

ETCHING METHOD FOR PHOTORESISTS OR POLYMERS

ORIGIN OF THE INVENTION

The invention described herein was made by employees of the U.S. Government and may be manufactured and used by or for the government for governmental purposes without payment of any royalties thereon or therefor.

CROSS REFERENCE OF RELATED APPLICATION

This application is a continuation-in-part of application Ser. No. 150,169, filed on Jan. 29, 1988 now abandoned.

FIELD OF THE INVENTION

This invention relates to methods for dry etching and/or thinning polymers, stripping photoresists from semiconductors, and removing organic matter or residue from substrates. More particularly it relates to plasma etching methods wherein the products of an electric discharge in a reactive gas are reacted with a sacrificial organic solid to produce a more highly reactive etching agent or gas mixture.

BACKGROUND OF THE INVENTION

Many applications exist for improved methods for removing polymers and other organic materials from substrates. For example, certain steps in the fabrication of semiconductor devices require etching of photoresists and cleaning of residual organic materials from surfaces. Many photoresists are based on polymers that have a large activation energy for etching reactions and thus are difficult to etch. Previously used dry etching methods for removing such materials have been characterized by various disadvantages and limitations including requirements for extreme and damaging reactive conditions, use of hazardous reactants and/or high temperatures, slow reactions and adverse loading effect.

One commonly used etching or thinning procedure for polymers or photoresists involves placing the sample to be etched directly in a plasma discharge. While such a procedure provides for effective etching, it presents a disadvantage in that the sample is exposed to highly energetic ions, electrons, photons and electric fields which can result in substrate damage, especially if the substrate is a semiconductor or integrated circuit. Electrostatic breakdown causing significant damage to semiconductor devices has been observed under the harsh conditions encountered in direct exposure to a plasma during photoresist stripping.

Another approach to etching or stripping of photoresists, which avoids the damaging direct exposure of the sample to the plasma, has been to establish a plasma discharge in one region of a reaction vessel, thus producing a reactive gas species in that region, with the sample being placed in a second region away from the plasma discharge. This type of process, known as downstream or afterglow etching, is exemplified by U.S. Pat. Nos. 4,368,092, Steinberg et al. and 4,554,047, Cook et al. Reaction rates obtained by this means are slow for difficult-to-etch polymers, and both of the cited patents require the use a hazardous reactant gas mixture, $CF_4$ and $O_2$, to enhance etch rates.

An etching process which makes use of a solid polymeric material as a source of reactive gas species is disclosed by Ahn et al. in U.S. Pat. No. 4,243,476. The solid material when struck by an ion beam releases reactive gases, which in turn react with and etch a sample. Various hydrocarbons and halogenated hydrocarbon polymers are disclosed for use as a solid material source, with halogenated polymers that release a highly reactive halogen-containing species being emphasized. While this process may result in enhanced etching rates, the solid material from which the reactive gas is obtained is located in the vicinity of the sample substrates so that both are subjected to bombardment by highly energetic ions. As pointed out above, direct exposure of a substrate to such conditions can result in substrate damage.

In addition to providing faster etching rates while avoiding conditions that may result in substrate damage, it is desired to avoid adverse results of the loading effect as described in the prior art. W. S. Ruska discloses in *Microelectronic Processing: An Introduction to the Manufacture of Integrated Circuits*, published by the MacGraw-Hill Company of New York, N.Y., in 1987, which is incorporated herein by reference, many aspects of processes to produce integrated circuits. Specifically, in Chapter 6, "Etching," Ruska discloses a number of specific reaction conditions to obtain etching. On page 221, he specifically discusses the loading effect of the etching process, as follows:

> "One further complication of plasma etching is the loading effect. The rates of many reactions are found to depend on the area (A below) of substrate being etched: a greater exposed area to be etched slows the reaction. This results from depletion of the reactive species from the plasma by the etching reaction. Consider an etch rate, with rate constant k dependent on a reactive species with a lifetime in the plasma $\tau$ and a volume generation rate (e.g. in molecules per liter$^{-1}$ sec$^{-1}$) G. Subject to some very plausible assumptions, the etch rate can be written as
>
> $$r = \frac{k\tau G}{(1 + kK\tau A)}$$
>
> where r is the etch rate, A is the area of material being etched and K is a constant determined by the reaction and the reactor geometry. It follows that r depends on A if the product of reaction rate, K, and lifetime $\tau$ becomes sufficiently large. A loading effect can be avoided by choosing a chemistry with a slow reaction rate or a short species lifetime. This, however, results in a decrease in the maximum etch rate, given by $K\tau$ G unless the species generation rate G can be made correspondingly large. The result is an unavoidable tradeoff between reaction rate and loading effect.
>
> "Loading effect is intrinsically undesirable and becomes especially troublesome when good endpoint control is crucial. As the etching process becomes almost complete, the area being etched decreases rapidly toward zero. If there is a substantial loading effect, the etch rate rises rapidly, resulting in a runaway etching of the remaining volume. If the reaction possesses any isotropy, the result can be excessive undercutting caused by fast etching of the small exposed area at the sides of the cuts."

The loading effect is also disclosed in the above-cited Cook et al. patent which is concerned with avoiding the effect by control of certain process and reactor features differing in many respects from the present invention. The loading effect mentioned in the prior art has been characterized by a decrease in sample etch rate with increased reactor loading.

Prior art processes are further exemplified by U.S. Pat. Nos. 4,412,119, Komatsu et al.; 3,692,655, Vossen Jr.; and 4,612,099, Tanno et al. These patents are concerned, respectively, with plasma etching of a sample within the plasma, radio frequency sputter etching, and reactive ion etching, all of them employing features that differ widely from the present invention.

SUMMARY OF THE INVENTION

The present invention is directed to a method for etching a sample of material in which a reactive gas such as oxygen is exposed to an electric discharge forming a plasma in a first region of a reaction vessel, a sacrificial organic solid material is placed in the vessel so as to be exposed to the gas mixture produced in the plasma region, and the sample to be etched is located in a second region downstream of and well removed from the plasma, the sample being etched by a highly reactive gas mixture produced by reaction of the sacrificial material with the plasma-produced gas mixture. The starting reactive gas may also be subjected to ultraviolet radiation, with a sacrificial solid organic material being contacted by the resulting gas species to produce a highly reactive gas mixture which is reactive with the sample. In embodiments using a plasma, the sacrificial solid organic material may be located in the plasma discharge region, but preferably is placed downstream in proximity to the sample being etched or cleaned.

Placement of the sample being etched downstream and away from the luminous plasma prevents damage to the sample and substrates that would otherwise occur from direct exposure to the plasma, and use of the sacrificial solid material provides for etching with a highly reactive gas mixture at rates much higher than otherwise obtainable. Contrary to the disclosure of Ruska, supra, which would lead one to believe that adding an organic solid material to a reactor containing a material to be etched would decrease the reaction rate, the present invention provides an enhanced etch rate by this measure, which is exactly the reverse of that commonly observed. Although the invention is not to be understood as limited to a particular theory, the improved etch rate is postulated, in the case of using oxygen gas as the reactive gas introduced to the plasma region and a hydrocarbon polymer such as polyethylene for the sacrificial solid material, to result from a reaction of atomic oxygen produced in the plasma with hydrogen atoms in the sacrificial polymer to produce OH radicals in the resulting gas mixture, these radicals reacting readily with the sample and being continuously replenished in a manner that avoids a loading effect. Unlike many prior methods, the present invention does not require hazardous flourine- or chlorine-containing gas species in the etching gas, and high temperatures likewise are not required.

It is, therefore, an object of this invention to provide a plasma etching method for removing polymers or photoresists or cleaning organic matter from substrates wherein damaging direct contact of the substrate with a plasma discharge is avoided.

Another object is to provide such a method wherein increased etching rates are obtained.

Still another object is to provide an etching method that is effective for etching highly stable polymers such as polyimides and fluorocarbons.

Yet another object is to provide a plasma etching method that does not require the use of hazardous gas mixtures.

BRIEF DESCRIPTION OF THE DRAWINGS

FIG. 1 shows a schematic of one embodiment of the apparatus for performing the etching method wherein the sacrificial solid organic material (13A) is physically located below the surface of the material to be etched (13).

DETAILED DESCRIPTION OF THE INVENTION AND PREFERRED EMBODIMENTS

The method of this invention is broadly applicable to etching or removing of polymers and other organic materials, but is primarily concerned with polymers and other materials that are difficult or slow to remove by existing downstream etching or cleaning processes. In particular, polyimides such as polypyromellitimide (Kapton TM available from du Pont), polystyrene, fluorocarbon polymers such as polytetrafluoroethylene (Teflon TM available from du Pont), and photoresists that may be based on such polymers or other polymers may be readily etched by this method. A specific application for the present invention is for etching or removal of such materials from substrates of semiconductor materials such as silicon or GaAs in the fabrication of semiconductor devices and integrated circuits.

The starting reactive gas, which is converted to more reactive species upon being subjected to an electric discharge, producing a plasma, may comprise various gases or gas mixtures, with oxygen, nitrogen, and mixtures thereof being preferred and oxygen alone being more preferred. Other gases which may be used include fluorine, chlorine, nitricoxide, nitrous oxide, nitrogen dioxide, hydrogen, water vapor, or mixtures of these gases. Oxygen is preferred because of its high degree of effectiveness and its lack of toxicity.

The sacrificial solid organic material provides highly reactive gas species upon being exposed to the species derived from a plasma. Any non-volatile organic solid which exhibits a substantially higher reactivity to the reactive gas than the material being etched exhibits to such gas may be used. Examples of suitable material for this purpose include polymers such as poly(vinyl fluoride), polyethylene, polypropylene, cispolybutadiene, trans 1, 4-polybutadiene, polyacrylonitrile, poly(vinyl chloride), poly(vinyl bromide), cellulose acetate, cellulose butyrate or polystyrene, with polyethylene and poly(vinyl fluoride) being preferred. Non-polymeric hydrocarbon materials such as paraffin may also be used.

Figure 2:
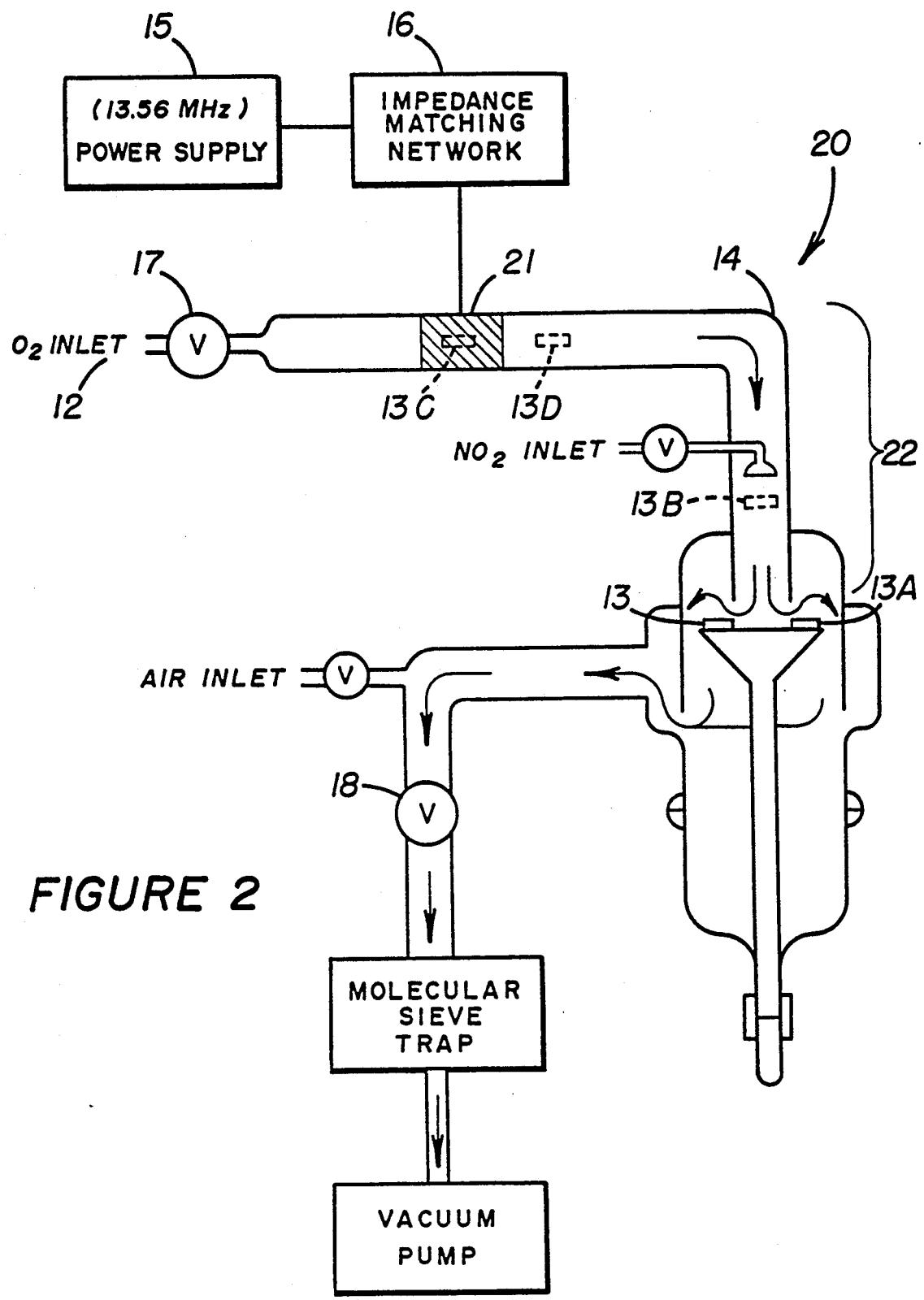
FIG. 2 shows a schematic similar to FIG. 1 of a second embodiment wherein the sacrificial solid organic material (13A) and materials to be etched (13) are immediately adjacent to each other.

Referring to FIGS. 1 and 2 of the drawings, plasma reactors 10 and 20 are shown with external electrodes 11 and 21 used to generate plasmas in which more reactive gas species are produced from oxygen gas 12. Important features of the reactor used for this procedure are: the electrodes 11 and 21 are regions of plasma generation separated from the sacrificial polymer 13A, and the sample to be etched 13 by a distance small enough to promote etching but not close enough to heat or destroy the sample to be etched (generally between about 5 and 50 cm, preferably about 16 cm). The reaction tubes have an angle of between about 30° to 120° at point 14. Preferably, an angle of about 90° separates the sample 13 from the plasma. Under these conditions, exposure of the polymer 13 to ions, electrons, photons, and electrical fields is negligible. The power supply 15 for the electrodes is operated in one embodiment at 13.56 MHz. Of course, other frequencies may be used to produce the plasma generated gas species. Other frequencies which are useful are between about 0 cycles (direct current) and microwave frequencies of about one 1 GHz. Preferably, frequencies between about 1 and 20 MHz are used. More preferably, frequencies between about 5 and 15 MHz are used. The power supply is connected to electrodes via an impedance matching network 16. A plasma is produced by applying Rf power to the electrodes, and a typical net operating power is 15 watts. Other power ranges which may be used include, for example, between 1 and 1,000 watts, preferably between 10 and 100 watts, and more preferably between 10 and 20 watts. Thermocouple 14A (lead 14B) is present to monitor the temperature of the sample being etched. Generally, the reaction configuration is at about ambient temperature, except for the source of energy (plasma, UV). Temperatures as high as about 100° C. and as low as about 0° C. are also useful at the etching site. Pressure within the reactors is maintained at a level suitable for plasma generation by vacuum pumps as shown, and values between 0.1 Torr and 10.0 Torr, and typically 0.5 Torr, may be used.

Figure 3A:
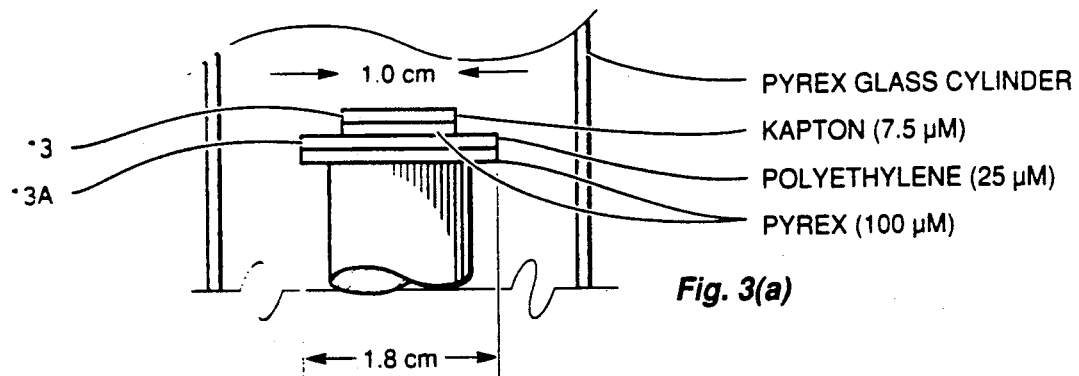
FIG. 3 in views (a) to (e) show different spatial arrangements for the sacrificial material and the material to be etched.
Figure 3B:
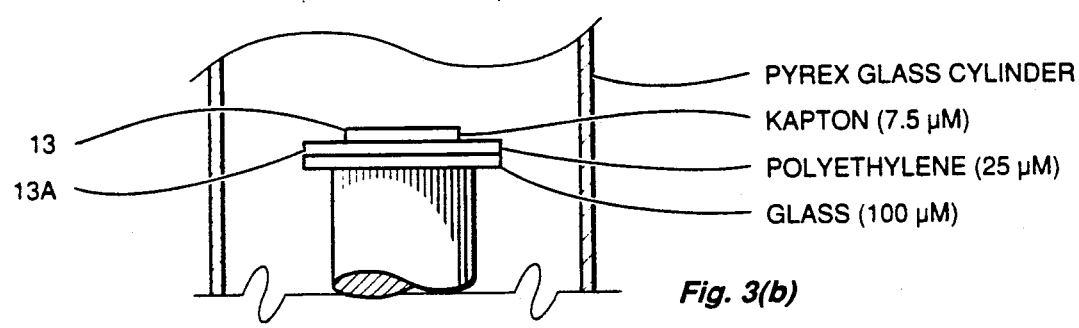
Figure 3C:
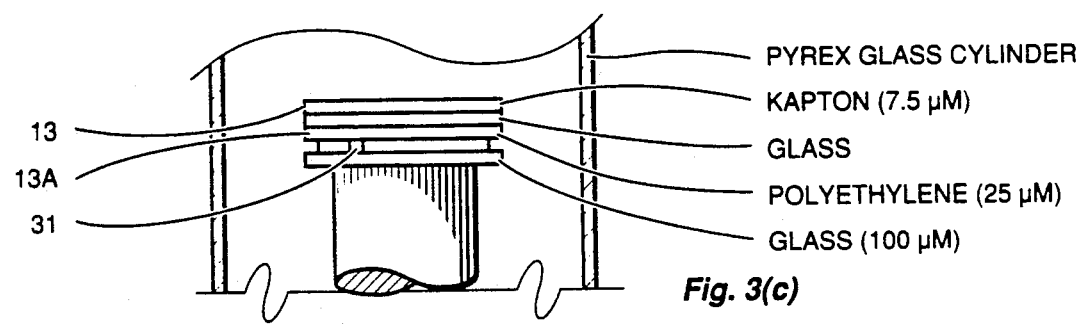
Figure 3D:
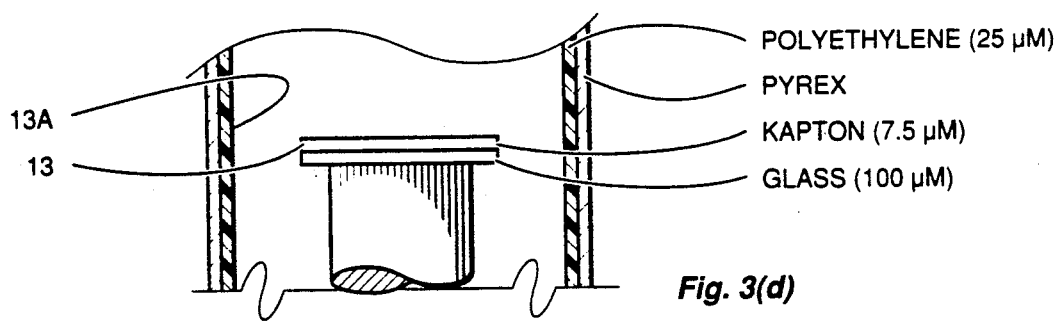
Figure 3E:
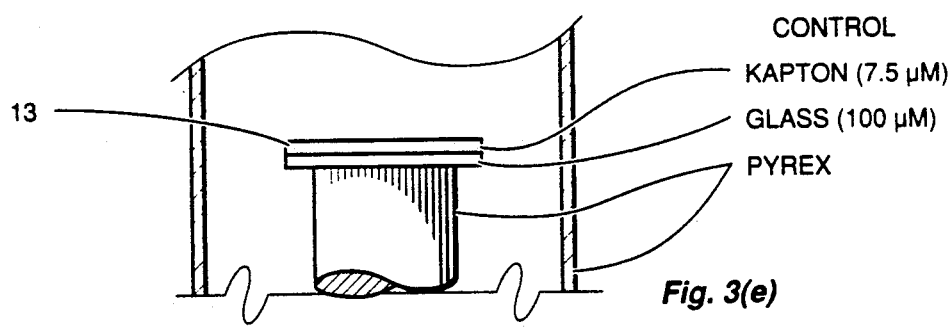

Different spatial configurations for the sample to be etched 13 and the sacrificial solid organic material 13A are shown in FIGS. 3(a) to 3(e). The numbers at the left side of FIG. 3 describe the general materials. The actual named materials found on the right-hand side of the drawing refer to specific materials which were examined. In the specific cases, FIG. 3(e) shows the control configuration wherein the Kapton polymer (polypyromellitimide) to be etched is placed horizontally on a glass stand within the reactant chamber. No sacrificial organic solid or polymer is present.

In FIG. 3(a) is shown a vertical downward arrangement of horizontal layers of Kapton, pyrex (or glass), polyethylene, and pyrex (or glass), respectively. When subject to the reactive gas species, the Kapton is etched at a faster rate than in the controlled experiment, FIG. 3(e).

In FIG. 3(b) is shown a vertical downward arrangement of horizontal layers of Kapton, polyethylene, and glass. when subjected to the reactive gas species, the Kapton is etched at a faster rate than the controlled experiment, FIG. 3(e).

In FIG. 3(c) is shown a vertical downward sequence of horizontal layers of Kapton, pyrex (or glass), polyethylene, and pyrex (or glass) wherein the pyrex (or glass) is a short cylinder which has one or more openings 31 so that the plasma generated particles are in contact with the lower surfaces of the polyethylene and top surface of the glass. When subjected to the produced reactive gas species, the Kapton is etched at a faster rate than in the controlled experiment, FIG. 3(e).

In FIG. 3(d) is shown a vertical downward sequence, horizontal layers of Kapton and glass. The polyethylene is shown as a thin cylindrical layer on the inside of the reaction vessel. When this configuration is subjected to the plasma generated gas particles, the Kapton is etched at a faster rate than the controlled experiment, FIG. 3(e).

Figure 4:
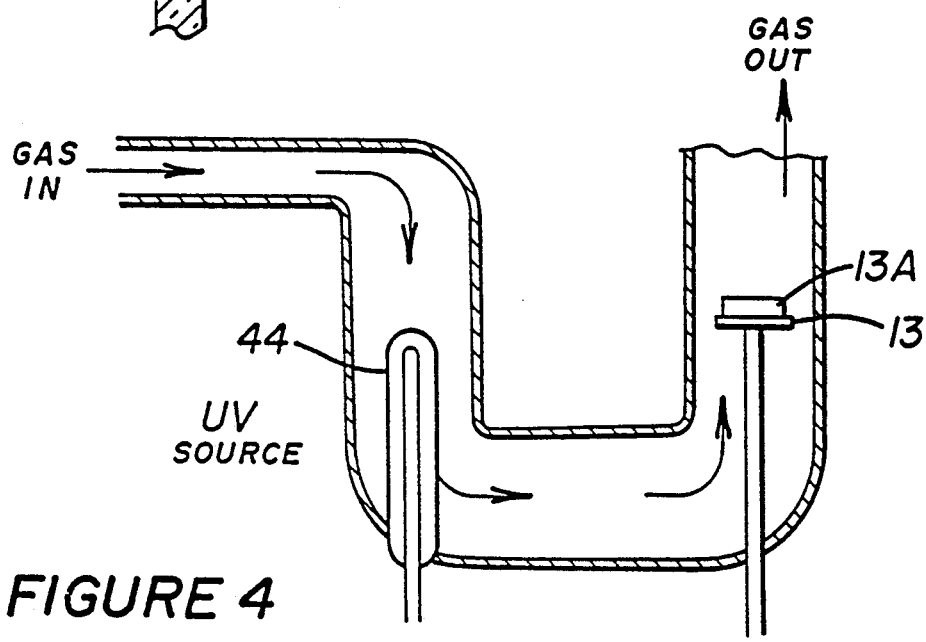
FIG. 4 shows a schematic of an embodiment of the invention wherein highly reactive gas species are produced by direct UV radiation of the reactive gas.

In FIG. 4 is shown the configuration wherein a standard UV lamp 44 is used to irradiate the reactive gas which reacts with the sacrificial polymer of polyethylene 13A. When this configuration is used to produce the reactive gas species, the Kapton etches at a faster rate than it does in a similar configuration with polyethylene absent.

Figure 5:
FIG. 5 shows a cross section of one configuration for the sacrificial solid organic material surrounding the material to be etched.

In FIG. 5 is shown a partial cross-sectional view of the reaction system where the material to be etched 13 is in the shape of a flat circular disk, and a sacrificial polymer 13A is in the shape of a small hollow cylinder which immediately surrounds the material to be etched. When this configuration is subjected to the plasma generated gas particles, the material to be etched etches at a faster rate than it does in the controlled experiment of FIG. 3(e).

Figure 6:
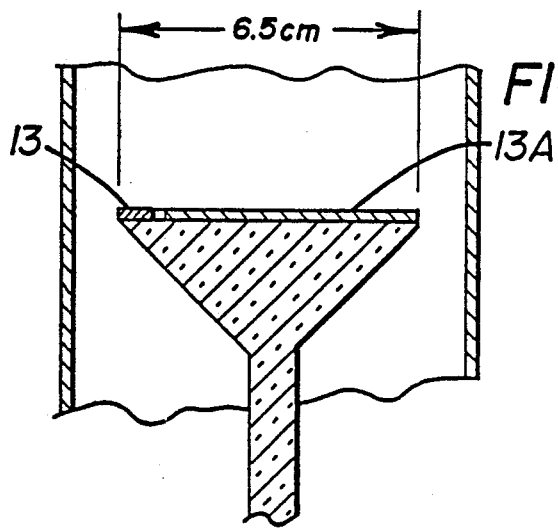
FIG. 6 shows a cross section of the sample holder for the sacrificial material and the sample to be etched.

In FIG. 6 is shown in partial cross-sectional view the reaction system wherein the surface area of the material to be etched 13 is fairly small compared to the surface area of the sacrificial polymer 13A.

Figure 7:
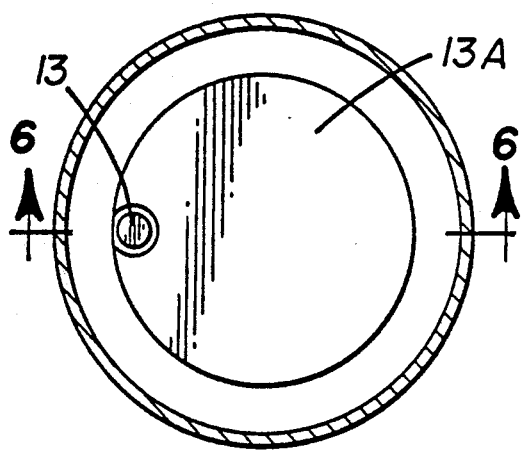
FIG. 7 shows a top plan view of sacrificial material surrounding the edge of the sample to be etched.

In FIG. 7 is shown a top plan view of the experimental arrangement shown in FIG. 6 wherein a small sample to be etched as a flat disk 13 is placed adjacent to and surrounded by a larger sacrificial polymer 13A. When this arrangement is subjected to the plasma generated gas particles, the material to be etched is etched at a faster rate than is the material to be etched in the controlled experiment, FIG. 3(e).

Figure 8A:
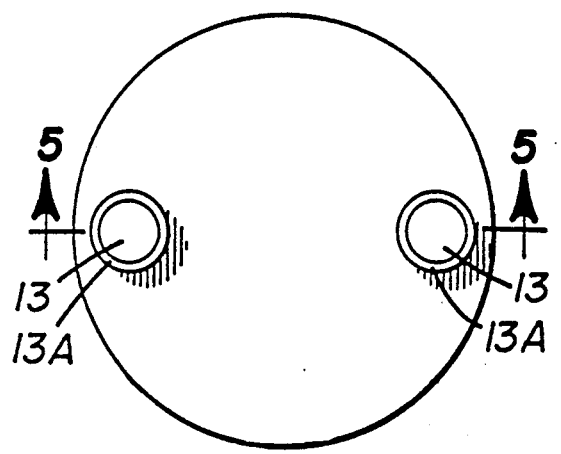
FIG. 8A shows a top plan view where a number of samples as shown in FIG. 5 are etched at the same time.

In FIG. 8A is shown a top plan view of the samples to be etched 13 which are surrounded by the sacrificial polymer 13A. This is essentially a top view of FIG. 5. When this configuration of FIG. 8A is exposed to plasma generated gas particles, the material to be etched etches at a faster rate than it does in the controlled experiment, FIG. 3(e).

Figure 8B:
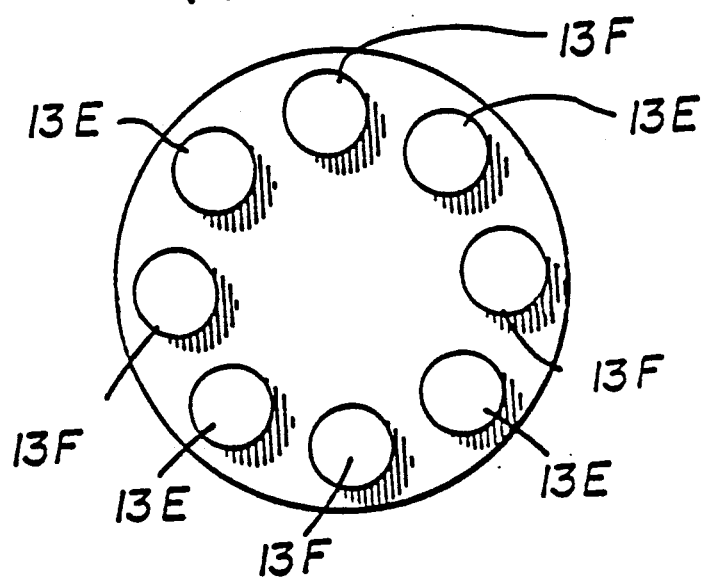
FIG. 8B shows a top plan view wherein the sample to be etched (13E) and the sacrificial material (13F) are adjacent to each other.

Another embodiment is shown in FIG. 8B as a top plan view wherein the material to be etched 13E is separated, but generally adjacent to (about 0.25 to 12.5 cm) and in close proximity to the sacrificial polymer 13F. When the material to be etched 13E is subjected to the reactive gas species in this arrangement, material 13E etches at a faster rate than it does relative to the controlled experiment of FIG. 3(e).

In another embodiment it is also possible to modify FIG. 2 so that the solid organic material source 13A is moved from the glass holder into the area of the conveying tube shown as area 22. In one example, sacrificial polymer is moved to the position shown in phantom outline as 13B. When the material to be etched 13 is subjected to this arrangement, it etches faster than does the sample of the controlled experiment shown in FIG. 3(e).

In another separate embodiment it is also possible to modify FIG. 2 so the sacrificial polymer 13A is moved from the glass platform into the actual plasma or immediate plasma afterglow as shown in the positions in phantom outline as sacrificial polymer 13C or 13D, respectively. when the material to be etched 13 is subjected to the reactive gas species in this arrangement with sacrificial polymer 13C or 13D, it etches at a rate faster than does the identical sample of the controlled experiment of FIG. 3(e).

The following examples are to be interpreted as illustrative only and are not to be considered as limiting in any way. The materials used are available from various chemical suppliers as listed in *Chemical Sources*, published annually by Directories Publications, Inc., of Columbia, S.C.

EXAMPLES 1-5

Etching of Kapton Using Polyethylene

The sample to be etched 13 (Kapton) is placed in the reactor with the sacrificial polymer, a sheet of polyethylene 13A. Other polymers which have a fast etch rate such as polyoctenamer have also been observed to be effective as a sacrificial polymer. Various configurations of the polyethylene sheet with respect to the sample to be etched are shown in FIG. 3. Following loading, the reactor (FIG. 1) is evacuated to a pressure of 0.004 millimeters of Hg or less. Then the valve 17 controlling the oxygen gas inlet is adjusted so that there is a flow of oxygen, typically 4 cm$^3$ (STP)/min. The valve 18 leading from the reactor to the pump is adjusted so that the reactor operating pressure is typically about 0.5 millimeters of Hg. Improved etching of polymers has been observed to occur at other reactor pressures in the range of about 0.05 to 1 millimeter of Hg and flow rates from about 0.5 to 10 cm$^3$ (STP)/min.

The results obtained on samples of 7.5 micrometer thick Kapton Type H polymer (from du Pont, Wilmington, Del.) are reported in Table 1 below.

TABLE 1

| Etch Rate of Kapton Type H in the Presence of Polyethylene | | | |
|---|---|---|---|
| Configuration Fig. # | Etch Rate ($\delta$) of Kapton H ($\delta\mu$m/hr) | $\delta/\delta$ (control) | Weight Polyethylene Lost (mg/hr) | Area Polyethylene Sheet (cm$^2$) |
| 3 (e) (control) | 0.0075 | 1 | none | none |
| 3 (a) | 0.472 | 63 | 2.18 | 2.67 |
| 3 (b) | 0.975 | 130 | 4.97 | 3.01 |
| 3 (c) | 0.682 | 91 | 4.54 | 3.17 |
| 3 (d) | 0.540 | 73 | 13.96 | 26.24 |
| 6 | 0.105 | 14 | 4.133 | 26.24 |

Kapton = polypyromellitimide

It is also observed that a film of Shipley Microdeposit S1400-27, a commonly used photoresist, deposited on a glass coverslip and then hard baked according to the manufacturer's instructions, etched 35 times faster when it was substituted for Kapton H in configuration 3(d) than it did when it was substituted for Kapton H in the control configuration.

The specific experimental results are shown below in Table 2.

TABLE 2

| Etch Rate of Shipley Photoresist in the Presence of Polyethylene | | | | |
|---|---|---|---|---|
| Configuration Fig. # | Etch Rate ($\delta$) of Photoresist ($\delta\mu$m/hr) | $\delta/\delta$ (control) | Weight Polyethylene Lost (mg/hr) | Area Polyethylene Sheet (cm$^2$) |
| 3 (e) (control) | 0.0118 | 1 | none | none |
| 3 (d) | 0.4200 | 35 | 10 | 20 |

EXAMPLE 6

Etching of Kapton with Tedlar TM

As sacrificial organic solids, Tedlar and polyethylene are comparable in effectiveness in etching Kapton sheet. Adjacent samples of polyethylene and Kapton are exposed in configuration FIG. 8B. Samples of Tedlar and Kapton ae also exposed using configuration FIG. 8B, substituting the Tedlar for the polyethylene. The etch rate for Kapton for both cases is found to be ten times the etch rate for Kapton in the control configuration.

The specific experimental results are shown below in Table 3.

TABLE 3

| Etch Rate of Kapton Type H in the Presence of Tedlar (TED) or Polyethylene (PE) | | | | |
|---|---|---|---|---|
| Configuration Fig. # | Etch Rate ($\delta$) of Photoresist ($\delta\mu$m/hr) | $\delta/\delta$ (control) | Weight TED or PE Lost (mg/hr) | Area TED or PE Sheet (cm$^2$) |
| 3 (e) (control) | 0.0075 | 1 | none | none |
| 8 (a) (Tedlar) | 0.075 | 10 | 2.528 | 10 |
| 8 (a) (Polyethylene) | 0.074 | 10 | 1.6 | 10 |

Tedlar = poly(vinyl fluoride)

EXAMPLE 7

Etching of Teflon

When Teflon is substituted for Kapton in the control configuration, the etch rate is 0.0015 micrometer/hr. When Teflon is etched in the configuration of FIG. 3(b), it etches at a rate of 0.059 micrometer/hr. This result represents a 39-fold increase in etch rate of Teflon when the sacrificial polyethylene polymer is present. In addition to etching at a faster rate, this procedure may provide an etched surface with improved adhesion and bonding characteristics, enabling dyeing and printing on the surface.

The specific experimental results are shown below in Table 4.

TABLE 4

| Etch Rate of Teflon in the Presence of Polyethylene | | | | |
|---|---|---|---|---|
| Configuration Fig. # | Etch Rate ($\delta$) of Teflon ($\delta\mu$m/hr) | $\delta/\delta$ (control) | Weight Polyethylene Lost (mg/hr) | Area Polyethylene Sheet (cm$^2$) |
| 3 (e) (control) | 0.0015 | 1 | none | none |
| 3 (b) | 0.059 | 39 | 5.695 | 5 |

While some embodiments of the invention have been shown and described herein, it will become apparent to those skilled in the art that various modificiations and changes can be made in the method to etch photoresists and the like using a reactive gas, a sacrificial polymer in a plasma discharge or the afterglow of a plasma discharge or subjecting the sacrificial polymer to the products of a direct ultraviolet radiation of a reactive gas without departing from the spirit and scope of the present invention. All such modifications and changes coming within the scope of the appended claims are intended to be covered thereby.

We claim:

1. A method for etching a sample which is a polymer or photoresist deposited on a semiconductor substrate thereof to remove said polymer or photoresist without damaging said substrate, which method comprises the steps of:
   (a) locating said sample in the etching region of a plasma reactor having both a plasma region and a separate etching region spaced apart from said plasma region;
   (b) locating in the etching region of said reactor a sacrificial organic solid material that has a substantially higher reactivity with the plasma-energized reactive gas generated in said plasma region than the polymer or photoresist being etched from said sample;
   (c) producing a plasma in a reactive gas in said plasma region at a reactor pressure of from 0.1 to 10.0 Torr whereby said plasma-energized gas is formed;
   (d) contacting said plasma-energized gas with said sacrificial organic solid material whereby a highly reactive gas is formed said highly reactive gas having a substantially higher reaction rate with said polymer or photoresist than said plasma-energized gas; and
   (e) contacting the sample with the resulting highly reactive gas at a sufficient concentration and for a sufficient time to etch said polymer or photoresist of said sample.

2. The method of claim 1 wherein said etching region is spaced apart from said plasma region a distance of 5 to 50 cm.

3. The method of claim 2 wherein the reactive gas in said plasma region is selected from oxygen, fluorine, chlorine, nitrogen, nitrous oxide, nitric oxide, nitrogen dioxide, hydrogen, water vapor, or mixtures thereof.

4. The method of claim 3 wherein said reactive gas in said plasma region comprises oxygen.

5. The method of claim 3 wherein said sacrificial organic solid material comprises an organic polymer.

6. The method of claim 5 wherein polymer is the sacrificial selected from poly(vinyl fluoride), polyethylene, polypropylene, cis-polybutadiene, trans 1, 4-polybutadiene, polyacrylonitrile, poly(vinyl chloride), poly(vinyl bromide), cellulose acetate, cellulose butyrate or polystyrene.

7. The method of claim 6 wherein said sacrificial organic solid material comprises polyethylene or poly(vinyl fluoride).

8. A method for removing polymeric material or photoresist from a semiconductor substrate coated with the same comprising:
   providing a plasma region and an etching region in a plasma reactor, said regions being spaced apart and in communication with one another through communication means including a corner or bend portion preventing movement of gases between said regions in a straight path;
   locating a sample of the polymer or photoresist coated substrate in said etching region;
   locating a sacrificial solid organic material in the etching region of said reactor, said sacrificial material having a substantially higher reactivity to plasma-energized gas generated in said plasma region than the polymeric material or photoresist being etched from said substrate;
   introducing a reactive gas into said plasma region and producing a plasma therein at a reactor pressure of from 0.1 to 10.0 Torr whereby said plasma-energized gas is formed;
   contacting the plasma-energized gas with said sacrificial solid organic material whereby a highly reactive gas is formed, said highly reactive gas having a substantially higher reaction rate with said polymeric material or photoresist than said plasma-energized gas; and
   contacting the coated sustrate with the highly reactive gas in said etching region at a sufficient concentration and for a sufficient time to remove said polymeric material or photoresist.

9. The method of claim 8 wherein said regions are spaced apart a distance of 5 to 50 cm.

10. The method of claim 9 wherein said communication means includes a corner or bend providing an angle of 30° to 120° therein.

11. The method of claim 8 wherein the reactive gas in said plasma region is selected from oxygen, fluorine, chlorine, nitrogen, nitrous oxide, nitric oxide, nitrogen dioxide, hydrogen, water vapor, or mixtures thereof.

12. The method of claim 11 wherein said reactive gas in said plasma region comprises oxygen.

13. The method of claim 11 wherein said sacrificial solid organic material comprises a polymer selected from poly(vinyl fluoride), polyethylene, polypropylene, cis-polybutadiene, trans 1,4-polybutadiene, polyacrylonitrile, poly(vinyl chloride), poly(vinyl bromide), cellulose acetate, cellulose butyrate or polystyrene.

14. The method of claim 13 wherein said sacrificial solid organic material comprises polyethylene or poly(vinyl fluoride).

* * * * *